(12) United States Patent
Koo et al.

(10) Patent No.: US 7,952,442 B2
(45) Date of Patent: May 31, 2011

(54) INTEGRATED CIRCUIT PACKAGE HAVING INDUCTANCE LOOP FORMED FROM SAME-PIN-TO-SAME-BONDING-PAD STRUCTURE

(75) Inventors: Yido Koo, Seoul (KR); Hyungki Huh, Seoul (KR); Kang Yoon Lee, Seoul (KR); Jeong-Woo Lee, Seoul (KR); Joonbae Park, Seoul (KR); Kyeongho Lee, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 466 days.

(21) Appl. No.: 11/274,825

(22) Filed: Nov. 16, 2005

(65) Prior Publication Data

US 2006/0081973 A1 Apr. 20, 2006

Related U.S. Application Data

(63) Continuation of application No. 10/927,014, filed on Aug. 27, 2004, now abandoned.

(60) Provisional application No. 60/498,353, filed on Aug. 28, 2003.

(51) Int. Cl.
*H03B 5/12* (2006.01)

(52) U.S. Cl. .............. 331/108 C; 331/36 C; 331/36 L; 331/117 D; 331/167

(58) Field of Classification Search .............. 331/36 L, 331/108 C, 108 D, 117 D, 36 C, 117 R, 117 FE, 331/167, 177 V
See application file for complete search history.

(56) References Cited

U.S. PATENT DOCUMENTS

| | | | |
|---|---|---|---|
| 5,477,194 A | 12/1995 | Nagakura | |
| 5,839,184 A | 11/1998 | Ho et al. | |
| 5,886,393 A | 3/1999 | Merrill et al. | |
| 6,034,423 A | 3/2000 | Mostafazadeh et al. | |
| 6,180,433 B1 | 1/2001 | Furey et al. | |
| 6,194,774 B1 | 2/2001 | Cheon | |
| 6,323,735 B1 * | 11/2001 | Welland et al. | 331/36 L |
| 6,765,284 B2 | 7/2004 | Gibson et al. | |
| 6,803,665 B1 | 10/2004 | Megahed et al. | |
| 6,806,106 B2 * | 10/2004 | Leighton et al. | 438/17 |
| 6,812,575 B2 | 11/2004 | Furusawa | |
| 6,876,266 B2 | 4/2005 | Koo et al. | |

* cited by examiner

*Primary Examiner* — Robert Pascal
*Assistant Examiner* — James E Goodley
(74) *Attorney, Agent, or Firm* — Muir Patent Consulting, PLLC

(57) ABSTRACT

An integrated circuit package includes an inductance loop formed from a connection of bonding wires and one or more input/output (I/O) package pins. In one embodiment, the inductance loop is formed from a first wire which connects a bonding pad on the integrated circuit chip to an I/O pin of the package and a second wire which connects the same bonding pad to the same pin. By forming the inductor loop within the limits of the integrated circuit package, a substantial reduction in space requirements is realized, which, in turn, promotes miniaturization.

5 Claims, 4 Drawing Sheets

INTEGRATED CIRCUIT PACKAGE HAVING INDUCTANCE LOOP FORMED FROM SAME-PIN-TO-SAME-BONDING-PAD STRUCTURE

REFERENCE TO RELATED APPLICATIONS

This application is a continuation of U.S. patent application Ser. No. 10/927,014, filed on Aug. 27, 2004, now abandoned which claims benefit of U.S. Provisional Application Ser. No. 60/498,353 filed Aug. 28, 2003, the contents of which is incorporated herein by reference.

BACKGROUND OF THE INVENTION

1. Field of the Invention

This invention generally relates to integrated circuits, and more particularly to an integrated circuit package having an inductance loop formed from at least one input/output pin of the package.

2. Description of the Related Art

One perennial goal among circuit designers is to decrease the size of integrated circuits. This goal is largely driven by market demand for ever-smaller consumer electronics, communications devices, and display systems to mention a few. There are, however, a number of impediments that undermine this goal, one of which will now be discussed.

Many integrated circuits are not self-contained devices. To ensure proper operation, these circuits must therefore be connected to one or more external components through connections which do not involve the use of an IC package input/output pin. This is accomplished, for example, by connecting the integrated circuit chip 1 to an off-package component 2 using bonding wires 3, as shown in FIG. 1. The need to establish off-package connections increases the cost and complexity of the manufacturing process and therefore is considered highly undesirable.

The approach taken in U.S. Pat. No. 6,323,735 is undesirable for at least two reasons. First, in order to form the inductor loop completely within the IC package, the package substrate must be formed to include bonding pads separate from the input/output package pins. The need to form these special pads increases the cost and complexity of the manufacturing process. Second, in order to accommodate the bonding pads, the size of the integrated circuit substrate must be increased and as a result more circuit board space is consumed. These effects undermine the goal of increasing integration and miniaturization.

Another approach, disclosed in the text "Wireless CMOS Frequency Synthesizer Design," by Craninckx, discloses a self-contained integrated circuit package containing an inductor loop. This loop is formed by connecting bonding wires between bonding pads on the IC chip and respective input/output pins of the IC package. The input/output pins are then connected by a third bonding wire. While this approach does not require the formation of special bonding pads on the package substrate, it is has at least two drawbacks that make it undesirable. First, like in the '735 patent, a bonding wire is used to connect the input/output pins. As previously noted, these wires are susceptible to damage during manufacture and/or use. Second, the input/output pins connected by the third bonding wire are located on opposite sides of the package. As a result, the third wire must pass over the IC chip. This is undesirable because the wire could short certain portions of the chip circuitry and introduce noise and other interfering influences which substantially degrade chip performance.

In view of the foregoing considerations, it is apparent that a need exists for an integrated circuit package which is more economical and requires fewer processing steps to manufacture than conventional IC packages, and which is also less susceptible to damage and noise which can degrade reliability and performance not only of the chip circuitry but also the host system of the chip. A need also exists for an integrated circuit package which is self-contained at least with respect to connection of an inductor loop connected to the chip, and which is able through this connection to achieve at least one of the aforementioned advantages.

SUMMARY OF THE INVENTION

An object of the present invention is to provide an integrated circuit package which is more economical and requires fewer processing steps to manufacture than conventional IC packages.

Another object of the present invention is to provide an integrated circuit package which is less susceptible to damage and noise which can degrade reliability and performance not only of the chip circuitry but also of the host system of the chip.

Another object of the present invention is to provide an integrated circuit package which is self-contained at least with respect to connection of an inductor loop to the IC chip and which is able through this connection to achieve at least one of the aforementioned advantages.

Another object of at least one embodiment of the present invention is to accomplish one or more of the aforementioned objects by reducing the number of bonding wires used to form the inductor loop compared with the number of wires used in conventional self-contained integrated circuits.

Another object of the present invention is to provide an integrated circuit package which does not require special bonding pads to be formed on the package substrate in order to form an inductor loop connected to the chip.

Another object of the present invention is to achieve one or more of the aforementioned objects by forming the inductor loop from at least one input/output pin of the package.

These and other objects and advantages of the present invention are achieved by providing a semiconductor package comprising an integrated circuit chip and an inductor loop which is connected in a self-contained manner within the package. This self-contained connection is accomplished by forming the loop from at least two conductors. The first conductor connects a bonding pad on the chip to an input/output pin of the package. The second conductor connects the same bonding pad on the chip to the same input/output pin of the package, thereby forming a loop. At least a third conductor may be added between the same pin and pad to increase the effective length of the inductor to thereby achieve a desired inductance. The conductors are preferably bonding wires.

In accordance with another embodiment, the semiconductor package comprises an integrated circuit chip and an inductor loop which is connected in a self-contained manner within the package. This inductor loop is formed from a plurality of sub-loops. The first sub-loop includes a first conductor which connects a bonding pad on the chip to an input/output pin of the package and a second conductor which connects the same bonding pad to the same pin. The second sub-loop includes one of the first and second conductors and a third conductor connected between the pin and pad. The conductors are preferably bonding wires.

The present invention is also an oscillator circuit which includes an active oscillator having two output nodes, an inductor loop coupled to the output nodes, and at least one capacitive circuit coupled to one of the output nodes. The capacitive circuit includes a capacitor, a resistor, and a first switch and the resistor provides a bias voltage to the capacitor when the first switch is open. The first switch couples and decouples the capacitor to the output nodes of the active oscillator. Preferably, the active oscillator and capacitive circuit are included in a semiconductor package which includes an integrated circuit chip. When configured in this manner, the inductor loop includes a first conductor connecting a bonding pad on the chip to an input/output pin of the package and a second conductor connecting the bonding pad on the chip to the input/output pin of the package. The first and second conductors may be bonding wires and the inductor loop may include at least a third conductor connecting the bonding pad on the chip to the input/output pin of the package.

In accordance with another embodiment, the present invention provides an oscillator circuit as previously described but with a different inductor loop configuration. This inductor loop includes has two sub-loops, the first of which includes a first conductor connecting a bonding pad on the chip to an input/output pin of the package and second conductor connecting the bonding pad on the chip to the input/output pin of the package. The second sub-loop includes one of the first conductor and the second conductor and a third conductor connecting the bonding pad on the chip to the input/output pin of the package. The first conductor and the second conductor are bonding wires.

DESCRIPTION OF THE PREFERRED EMBODIMENTS

The present invention is, in one respect, a semiconductor package having an integrated circuit chip and an inductor loop which is connected in a self-contained manner within the package. The present invention is also a system which is at least partially controlled by the inductor loop of the semiconductor device mentioned above. The system may be a communications system where the inductor loop is used to set a transmitter and/or RF carrier frequency or another type of system. The various embodiments of the invention will now be discussed in seriatim below.

Figure 1:
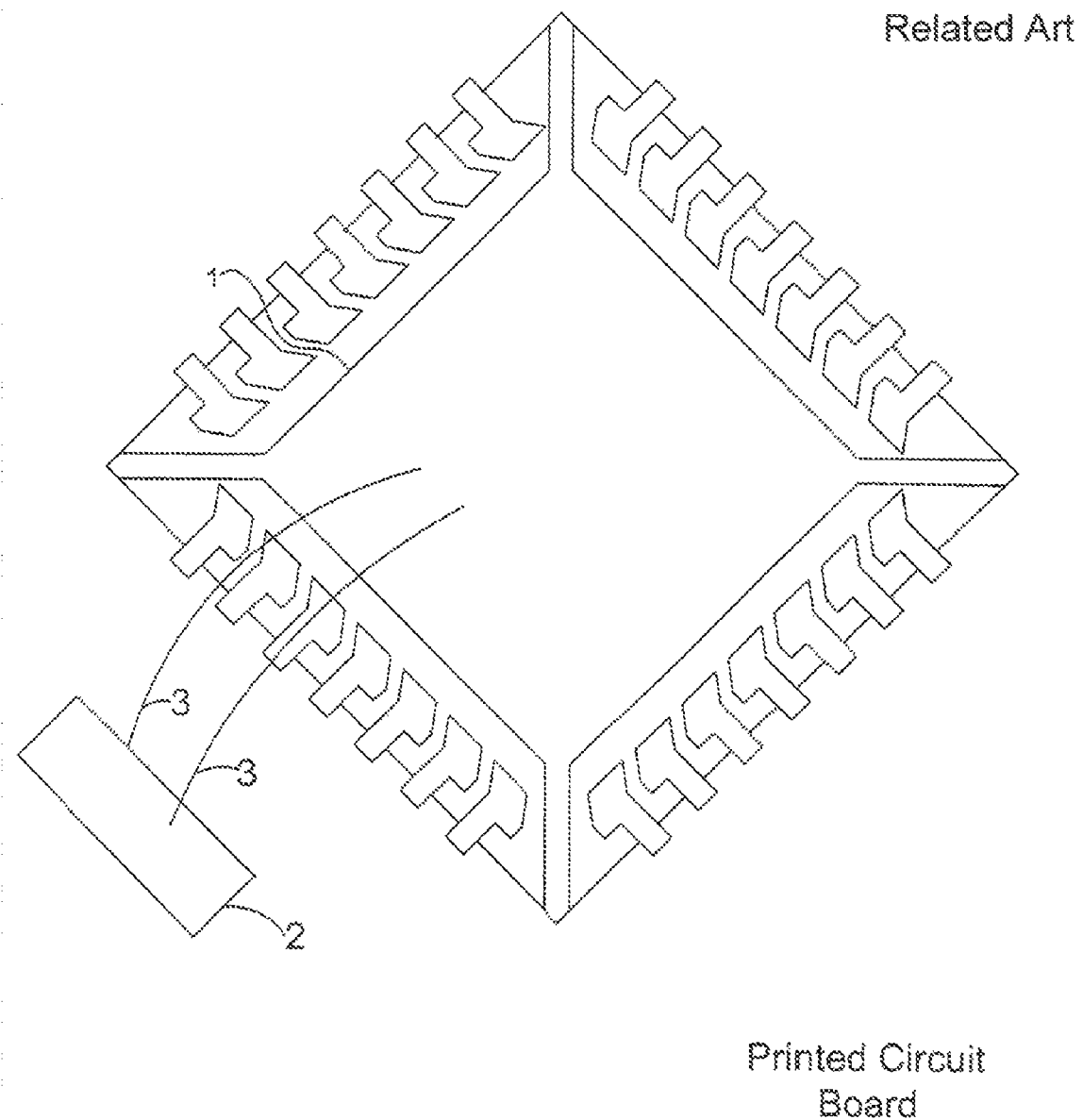
FIG. 1 is a diagram showing a conventional integrated circuit package which is not self-contained.
Figure 2:
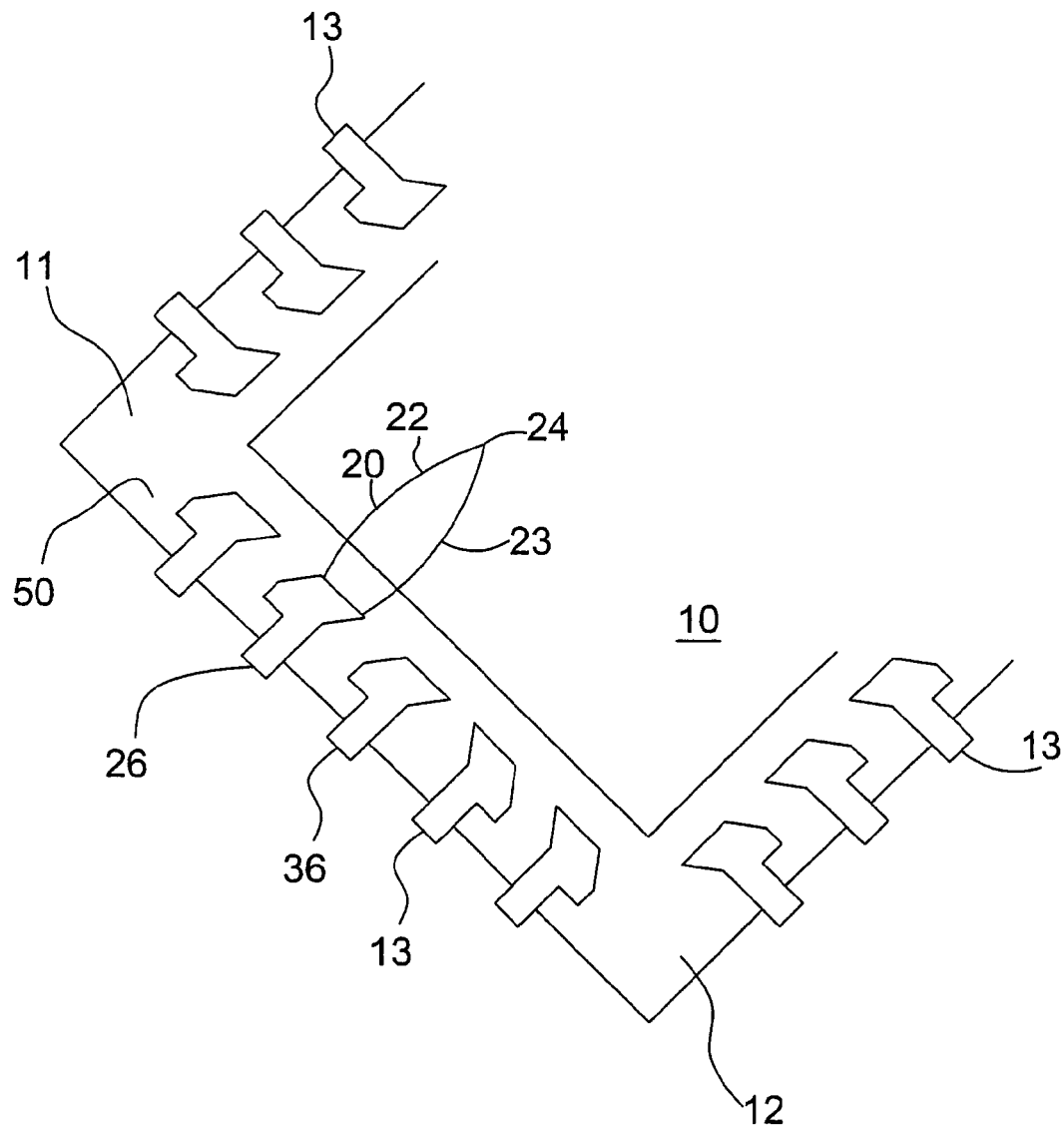
FIG. 2 is a diagram showing a semiconductor package in accordance with a first embodiment of the present invention.

FIG. 2 shows a semiconductor package in accordance with a first embodiment of the present invention. This package includes an integrated circuit chip 10 mounted on or within a package housing 11. The housing includes a substrate 12 for supporting the chip and a plurality of input/output (I/O) pins 13 formed on the substrate for electrically connecting the chip to one or more external circuits (not shown). The substrate may be any type known and the I/O pins may be connected to the chip using any one of a variety of conventional attachment techniques, including but not limited to wire bonds and solder bumps. Examples of packages of this type include lead frame packages, ball grid array (BGA) packages including those using tape automated bonding (TAB), pin grid array packages (PGA), thin small outline packages (TSOP), small outline J-lead packages (SOJ); small outline packages (SOP), and chip scale packages (CSP) to name a few.

The I/O pins may take any one of a variety of forms. For example, the pins are shown as external package leads disposed along a periphery of the package substrate. However, if desired the pins may be formed in other ways including but not limited to electrically conductive vias which extend through the package substrate to solder bump connections provided on an opposing side of the package.

The semiconductor package also includes an inductor loop 20 self-contained within the package. The inductor loop may be formed from two conductors. The first conductor 22 connects a first bonding pad 24 on the chip to a first input/output pin 26 of the package, and the second conductor 23 connects the same bonding pad to the same input/output pin. In this embodiment, the pin connects the two conductors to thereby complete the loop. The first and second conductors are preferably bonding wires.

Once the inductor loop is formed, it may be used to control one or more circuits on the integrated circuit chip. For example, if the integrated circuit includes a phase-locked loop, the inductance value of the loop may be used to set an output frequency or frequency band of this circuit. Alternatively, the length of the loop may be used to set other operational parameters of the chip. The inductance value of the loop depends on its overall length. This length may be set in various ways to achieve the desired inductance value. For example, the length of the first and second conductors may be set to have specific lengths based on a loop length to be achieved. The specific application of the inductor loop of the present invention may be adapted, for example, depending upon the parameters being set and the specific function to be performed by the integrated circuit.

Figure 3:
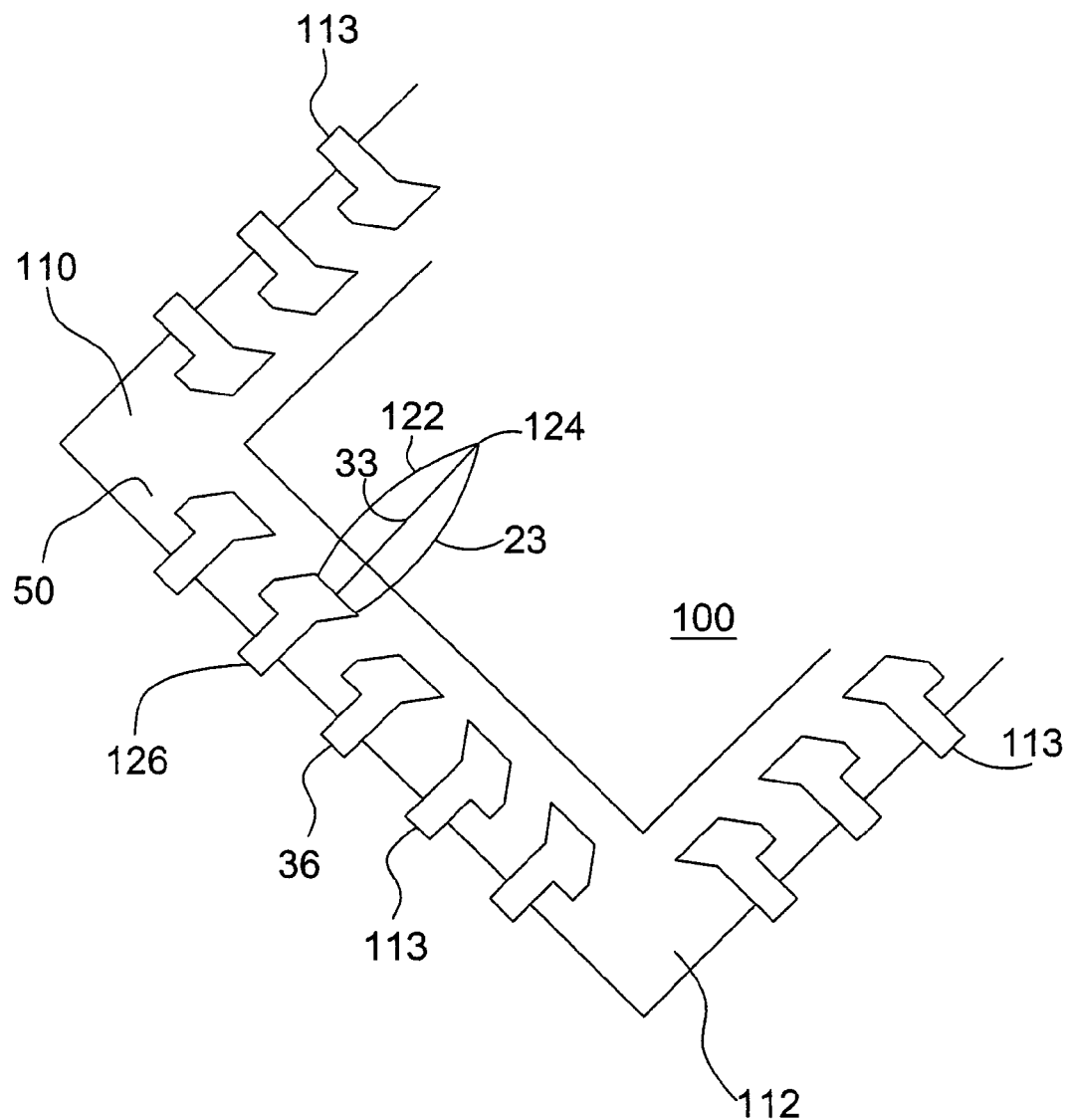
FIG. 3 is a diagram showing a semiconductor package in accordance with a second embodiment of the present invention.

FIG. 3 shows a semiconductor package in accordance with a second embodiment of the present invention. This package includes an integrated circuit chip 100 mounted on or within a package housing 110. The housing includes a substrate 112 for supporting the chip and a plurality of input/output (I/O) pins 113 formed on the substrate for electrically connecting the chip to one or more external circuits (not shown). The substrate may be made from a material and the I/O pins may be formed and connected in any of the ways noted in the discussion of the first embodiment.

The semiconductor package also includes an inductor loop 120 self-contained within the package. The inductor loop is formed from two sub-loops. The first sub-loop is formed by connecting a first conductor 122 between a bonding pad 124 on the chip and a first input/output pin 126 of the package and a second conductor 133 between the same bonding pad and package pin. The second sub-loop is formed by one of the first and second conductors and at least a third conductor 23 connected between the same pad and pin. The conductors are preferably bonding wires. The inductor loop therefore has an effective length (and thus an inductance value) based on the sum of the two sub-loops. Those skilled in the art can appreciate that additional conductors may be added between the pad and pin to increase the number of sub-loops comprising the inductor.

Figure 4:
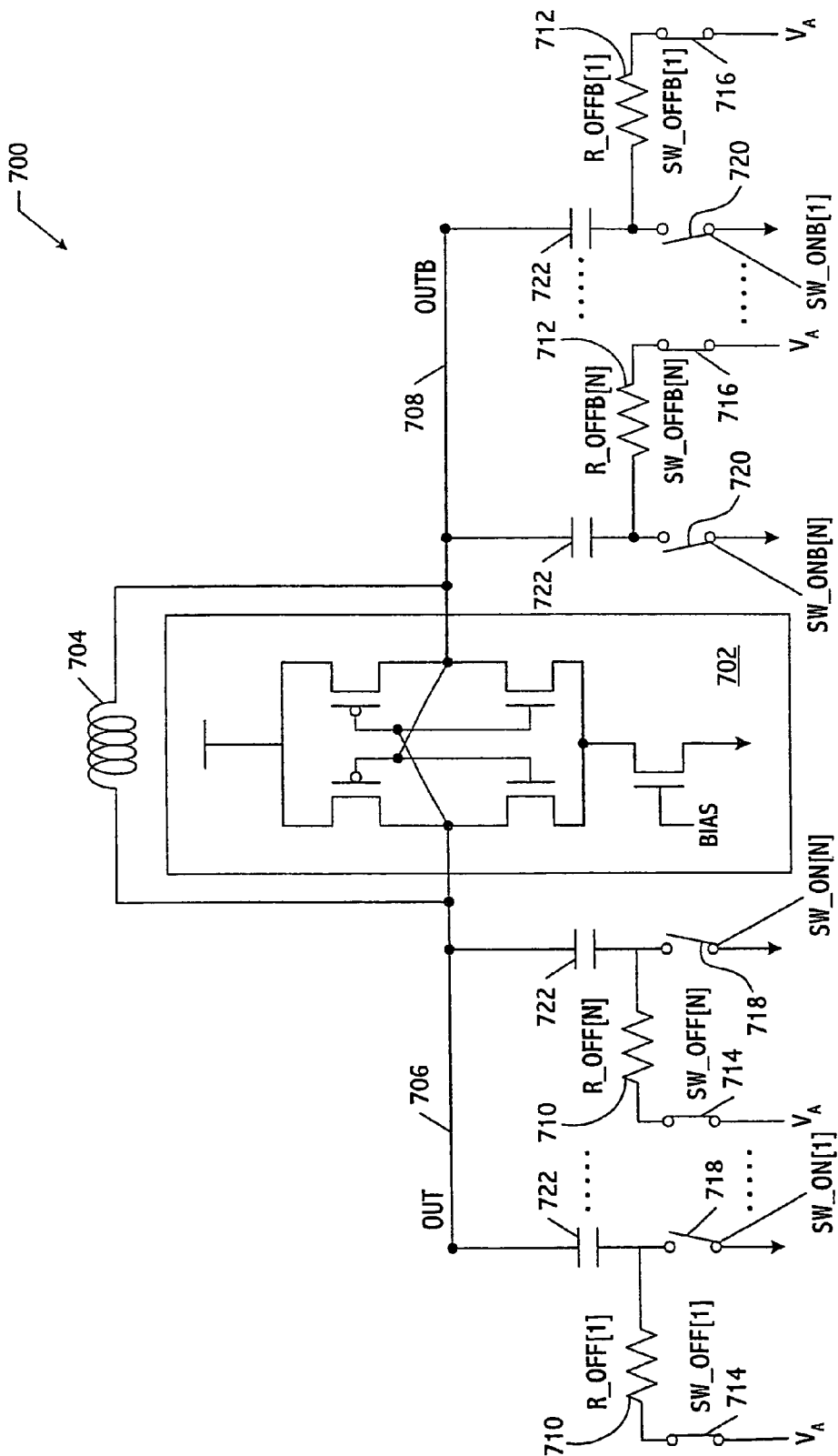
FIG. 4 is a diagram showing an oscillator circuit in accordance with one embodiment of the present invention.

FIG. 4 is a schematic diagram showing a voltage-controlled oscillator of the present invention. The oscillator includes active oscillator circuitry 702 and has a differential configuration with output nodes OUT 706 and OUTB 708. An inductor 704 is preferably coupled to the output nodes OUT 706 and OUTB 708. The inductor may be formed from any of the circuit arrangements shown in FIGS. 2 and 3. Two or more circuits having a capacitor 722 coupled in series with a switch 718 are coupled to OUT 706. The capacitor 722 is coupled to the output node 706 and switch 718. Switch 718 is preferably a transistor switch coupled to a reference voltage which, for example, can be a ground voltage.

The oscillator may further include a series-coupled resistance and switch such as a resistor 710 coupled in series with transistor switch 714. The resistor 710 is coupled at one end to a common node of capacitor 722 and transistor switch 718, and the transistor switch 714 is coupled between the other end of resistor 710 and a bias voltage V.

Similar components and connections preferably exist with respect to the output node OUTB 708. For example, a capacitor 722 is preferably coupled in series with transistor switch 720, and the other terminal of the capacitor 722 is coupled to the output node OUTB 708. Further, one terminal of transistor switch 720 is coupled to ground. Moreover, there is preferably a resistor 712 coupled in series with a transistor switch 716 such that the resistor 712 is coupled to a common node of the capacitor 722 and the transistor switch 720, and a terminal of the transistor switch 716 is coupled to the bias voltage $V_A$. Those skilled in the art will appreciate the capacitors 722 can have the same or different values. Likewise, the related resistors and switches can have the same of different values as determined by the specific design requirements of each application.

The bias level $V_A$ determines the common level in the off-state and can have any value from ground to supply voltage. Thus, the bias level $V_A$ can be generated from a simple bias generator such as a resistor divider. $V_A$ can also be ground or supply voltage itself.

A semiconductor package in accordance with any of the aforementioned embodiments may be used in any one of a variety of applications. One exemplary application is in a communication system where the inductor loop is used to set one or more parameters such as but not limited to an operating frequency. One illustrative embodiment of a voltage-controlled oscillator which may be included in such a communication system will now be described.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

We claim:

1. An oscillator circuit, comprising:
   an active oscillator having two output nodes;
   an inductor loop coupled to the output nodes; and
   at least one capacitive circuit coupled to one of the output nodes, said capacitive circuit including a capacitor, a resistor, and a first switch, wherein said resistor provides a bias voltage to the capacitor when the first switch is open and wherein said first switch couples and decouples the capacitor to the output nodes of the active oscillator, and wherein the active oscillator and capacitive circuit are included in a semiconductor package which includes an integrated circuit chip, said inductor loop including:
   a first conductor connecting a bonding pad on the chip to an input/output pin of a semiconductor package; and
   a second conductor connecting the bonding pad on the chip to the input/output pin of the package.

2. The oscillator circuit of claim 1, wherein the first conductor and the second conductor are bonding wires.

3. The oscillator circuit of claim 1, wherein the inductor loop includes at least a third conductor connecting the bonding pad on the chip to the input/output pin of the package.

4. An oscillator circuit, comprising:
   an active oscillator having two output nodes;
   an inductor loop coupled to the output nodes; and
   at least one capacitive circuit coupled to one of the output nodes, said capacitive circuit including a capacitor, a resistor, and a first switch, wherein said resistor provides a bias voltage to the capacitor when the first switch is open and wherein said first switch couples and decouples the capacitor to the output nodes of the active oscillator, and wherein the active oscillator and capacitive circuit are included in a semiconductor package which includes an integrated circuit chip, said inductor loop including:
   (a) a first sub-loop which includes a first conductor connecting a bonding pad on the chip to an input/output pin of the package and second conductor connecting the bonding pad on the chip to the input/output pin of the package; and
   (b) a second sub-loop which includes one of the first conductor and the second conductor and a third conductor connecting the bonding pad on the chip to the input/output pin of the package.

5. The oscillator circuit of claim 4, wherein the first conductor and the second conductor are bonding wires.

* * * * *